United States Patent [19]
Adams et al.

[11] Patent Number: 6,166,452
[45] Date of Patent: Dec. 26, 2000

[54] IGNITER

[75] Inventors: John Adams; Kevin Hovet, both of Lakeland, Fla.; Werner Kaiser, Nuremberg; Horst Belau, Iangquaid, both of Germany

[73] Assignees: Breed Automotive Technology, Inc., Lakeland, Fla.; Siemens, Munich, Germany

[21] Appl. No.: 09/233,925

[22] Filed: Jan. 20, 1999

[51] Int. Cl.[7] .................................................. F23Q 5/00
[52] U.S. Cl. .......................... 307/10.1; 361/247; 361/248
[58] Field of Search .......................... 307/10.1; 361/247, 361/248; 324/526; 340/650, 635; 714/16; 701/45; 431/258

[56] References Cited

U.S. PATENT DOCUMENTS

| | | | |
|---|---|---|---|
| 3,292,537 | 12/1966 | Goss et al. | 102/28 |
| 3,366,055 | 1/1968 | Hollander et al. | 102/28 |
| 3,818,330 | 6/1974 | Hiroshima et al. | 324/526 |
| 4,136,894 | 1/1979 | Ono et al. | 280/729 |
| 4,213,635 | 7/1980 | Inokuchi et al. | 280/737 |
| 4,708,060 | 11/1987 | Bickes et al. | 102/202.7 |
| 4,819,560 | 4/1989 | Patz et al. | 102/202.5 |
| 4,831,933 | 5/1989 | Nerheim et al. | 102/202.5 |
| 4,976,200 | 12/1990 | Benson et al. | 102/202.7 |
| 5,158,323 | 10/1992 | Yamamoto et al. | 280/734 |
| 5,179,248 | 1/1993 | Hartman et al. | 102/202.4 |
| 5,221,918 | 6/1993 | Boehner | 340/457.1 |
| 5,309,841 | 5/1994 | Hartman et al. | 102/202.4 |
| 5,327,834 | 7/1994 | Atkeson et al. | 102/202.9 |
| 5,333,138 | 7/1994 | Richards et al. | 714/16 |
| 5,337,674 | 8/1994 | Harris et al. | 102/530 |
| 5,389,822 | 2/1995 | Hora et al. | 307/10.1 |
| 5,416,360 | 5/1995 | Huber et al. | 307/10.1 |
| 5,490,069 | 2/1996 | Gioutsos et al. | 364/424.05 |
| 5,503,077 | 4/1996 | Motley et al. | 102/202.5 |
| 5,513,879 | 5/1996 | Patel et al. | 280/739 |

(List continued on next page.)

FOREIGN PATENT DOCUMENTS

| | | |
|---|---|---|
| 0183933 | 12/1990 | European Pat. Off. . |
| 69312609 | 3/1994 | European Pat. Off. . |
| 805074 | 11/1997 | European Pat. Off. . |
| 0834813 | 4/1998 | European Pat. Off. . |
| 2672675 | 8/1992 | France . |
| 3537820 | 4/1987 | Germany . |
| 3842917 | 11/1989 | Germany . |
| 3919376 | 12/1990 | Germany . |
| 3537820 | 7/1993 | Germany . |
| 4330195 | 11/1994 | Germany . |
| 19514282 | 10/1996 | Germany . |
| 19637587 | 3/1998 | Germany . |
| 19721839 | 10/1998 | Germany . |
| 2123122 | 1/1984 | United Kingdom . |
| 9630714 | 10/1996 | WIPO . |
| 9721565 | 6/1997 | WIPO . |
| 9728992 | 8/1997 | WIPO . |
| 9745696 | 12/1997 | WIPO . |
| 9834081 | 8/1998 | WIPO . |

OTHER PUBLICATIONS

Willis, Kenneth. "An Introduction to Semiconductor Initiation of Electroexplosive Devices." Presented at the Airbag 2000 Conference, Karlsruhe, Germany, Nov. 29/30, 1934.

*Primary Examiner*—Albert W. Paladini
*Attorney, Agent, or Firm*—Lonnie R. Drayer

[57] ABSTRACT

An igniter for igniting a reactive material has a conductor for conducting power and communication signals to and from the igniter. A controller is located within the igniter. The controller is preferably an application specific integrated circuit (ASIC). The controller has communication means for communicating with a master controller located remote from the igniter. The controller also has diagnostic means for comparing established parameters for components of the igniter to predetermined limits and sending fault warning messages and integrity status messages to the master control unit. The controller also further has means for receiving a unique igniter activation command from the master control unit and sending an activation signal to an igniter activation means that couples the energy stored in an energy storage capacitor to a heating member that ignites a reactive material.

25 Claims, 8 Drawing Sheets

U.S. PATENT DOCUMENTS

| | | | |
|---|---|---|---|
| 5,542,695 | 8/1996 | Hanson et al. | 280/729 |
| 5,554,890 | 9/1996 | Kinoshita et al. | 307/10.1 |
| 5,608,628 | 3/1997 | Drexler et al. | 364/424 |
| 5,613,702 | 3/1997 | Goetz et al. | 280/735 |
| 5,630,619 | 5/1997 | Buchanan et al. | 280/741 |
| 5,647,924 | 7/1997 | Avory et al. | 149/24 |
| 5,648,634 | 7/1997 | Avory et al. | 102/202.1 |
| 5,656,991 | 8/1997 | Hargenrader et al. | 340/438 |
| 5,659,474 | 8/1997 | Maeno et al. | 364/424 |
| 5,660,413 | 8/1997 | Bergerson et al. | 280/741 |
| 5,668,528 | 9/1997 | Kitao et al. | 340/436 |
| 5,707,078 | 1/1998 | Swanberg et al. | 280/739 |
| 5,709,406 | 1/1998 | Buchanan et al. | 280/737 |
| 5,718,452 | 2/1998 | Vogt et al. | 280/735 |
| 5,825,098 | 10/1998 | Darby et al. | 307/10.1 |
| 5,835,873 | 11/1998 | Darby et al. | 701/45 |
| 5,861,570 | 1/1999 | Bickes et al. | 102/202.7 |
| 5,912,427 | 6/1999 | Willis et al. | 102/202.8 |
| 5,957,988 | 9/1999 | Osajda et al. | 701/45 |
| 6,070,531 | 6/2000 | Hansen et al. | 102/202.5 |

IGNITER

FIELD OF THE INVENTION

The present invention relates generally to igniters for reactive materials and more specifically to igniters having the capacity to interpret control signals to determine if the igniter should ignite a reactive material, for example a reactive material in a gas generator associated with a device for protecting a vehicle occupant in the event of a crash.

BACKGROUND OF THE INVENTION

There are several scenarios in which it is desirable to selectively ignite separate units of reactive materials either simultaneously or sequentially depending upon selected variables. For example, in the event of a vehicle crash it would be advantageous if the gas generators used in the activation of various vehicle occupant protection devices, such as airbags and seat belt pretensioners, are actuated by a master control unit communicating with remote device control units located at the gas generators to selectively activate the gas generators in dependence upon various parameters. It would also be advantageous to have similar capabilities for selectively igniting various units of reactive materials, such as explosives, in mining or demolition operations.

One conventional type of system for controlling the initiation of gas generators used in the activation of vehicle occupant protection devices uses a central electronic control unit with a microprocessor. These systems usually have limited means of component failure detection. Another problem with activating the vehicle occupant protection devices directly from a central electronic control unit is that the activation signals are transmitted over hard wires directly to the vehicle occupant portion device. Cable short circuits of the activation signal to the battery voltage or ground could accidentally activate a vehicle occupant protection device. Induced transients and other electromagnetic interference could also have detrimental effects on safety device operation in such a system. Yet another disadvantage of such a system is that additional components must be added to the central electronic control unit as additional safety devices are added to a system. This adds to the space required to accommodate the central electronic control unit in the vehicle.

DISCUSSION OF THE PRIOR ART

U.S. Pat. Nos. 5,825,098 and 5,835,873 address the problems left unsolved by the conventional types of vehicle occupant protection control systems discussed above.

U.S. Pat. No. 5,825,098 teaches a vehicle occupant safety device controller that is capable of activating various safety devices to protect the occupants of a vehicle in the event of a crash. The safety device controller is capable of performing self-tests and sending the results of these tests to a master electronic control unit over a communication bus. Upon receipt of a coded command from the master electronic control unit, the safety device controller activates a safety device by discharging stored energy into a squib or electromechanical device to activate the safety device.

U.S. Pat. No. 5,835,873 teaches a vehicle occupant protection system having a master controller and a plurality of remotely located safety device controllers. The master controller receives input signals regarding selected variables such as seat location, crash severity, seat occupant size, and so forth. The system provides for fault detection and notification to the vehicle operator, as well as immunity from electromagnetic interference through the use of remotely located safety device controllers that communicate with the master electronic controller over a digital communications bus using coded commands and data. Each of the remotely located safety device controllers has the capability of performing self-tests and communicating with the master electronic control unit.

There is provided in accordance with the present invention igniters for reactive materials wherein the igniters have the capacity to interpret control signals to determine if the igniter should ignite the reactive material, for example in a gas generator. Such an igniter may be used as a component of vehicle occupant safety systems of the types disclosed in U.S. Pat. Nos. 5,825,098 and 5,835,873.

GB published patent application 2 123 122 teaches an igniter having a microelectronic circuit but does not teach or suggest that the microelectronic circuit have the capacity to perform self tests and send the results of these tests to a central electronic control unit over a communication bus like the igniter of the present invention.

SUMMARY OF THE INVENTION

There is provided in accordance with the present invention an igniter having a device controller integral therewith.

BRIEF DESCRIPTION OF THE DRAWINGS

The construction and method of operation of the invention, together with objects and advantages thereof, will be best understood from the following description of specific embodiments when read in connection with the accompanying drawings.

DETAILED DESCRIPTION OF THE INVENTION

Figure 1:
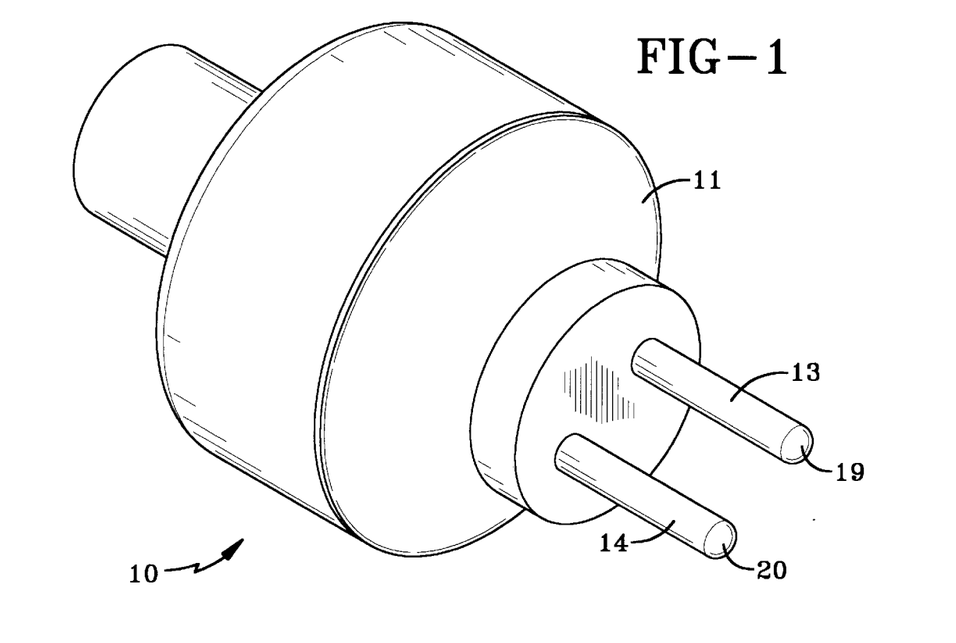
FIG. 1 is a perspective view of an igniter in accordance with the invention.

Referring first to FIG. 1 there is shown a perspective view of an igniter 10 in accordance with the invention. The structure and function of the igniter can best be described by simultaneously referring to FIG. 2, which is an exploded perspective view of the igniter, and FIG. 3 which is another exploded perspective view of the igniter looking from the opposite direction from the viewpoint of FIG. 2.

Figure 2:
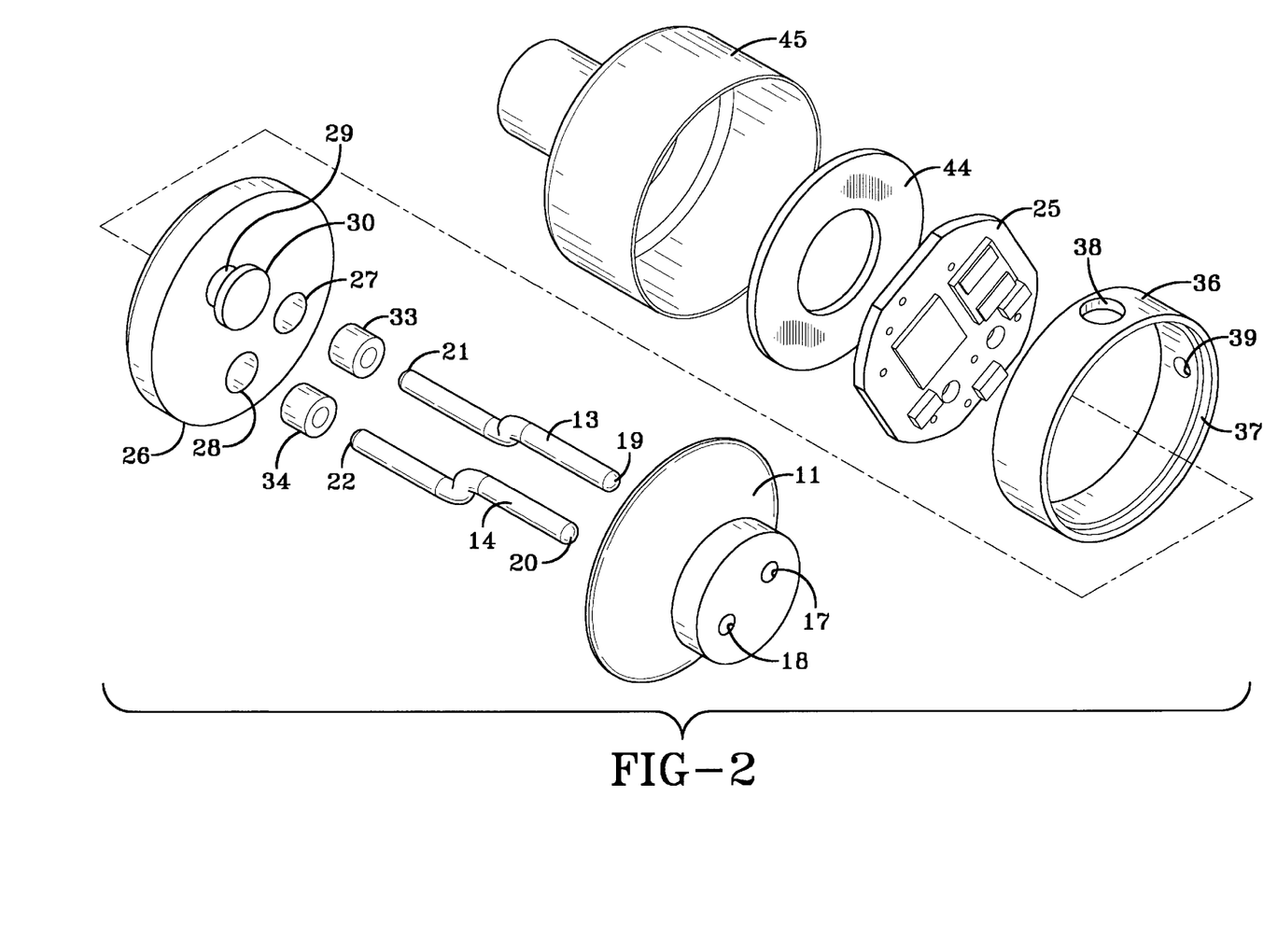
FIG. 2 is an exploded perspective view of the igniter of FIG. 1.
Figure 3:
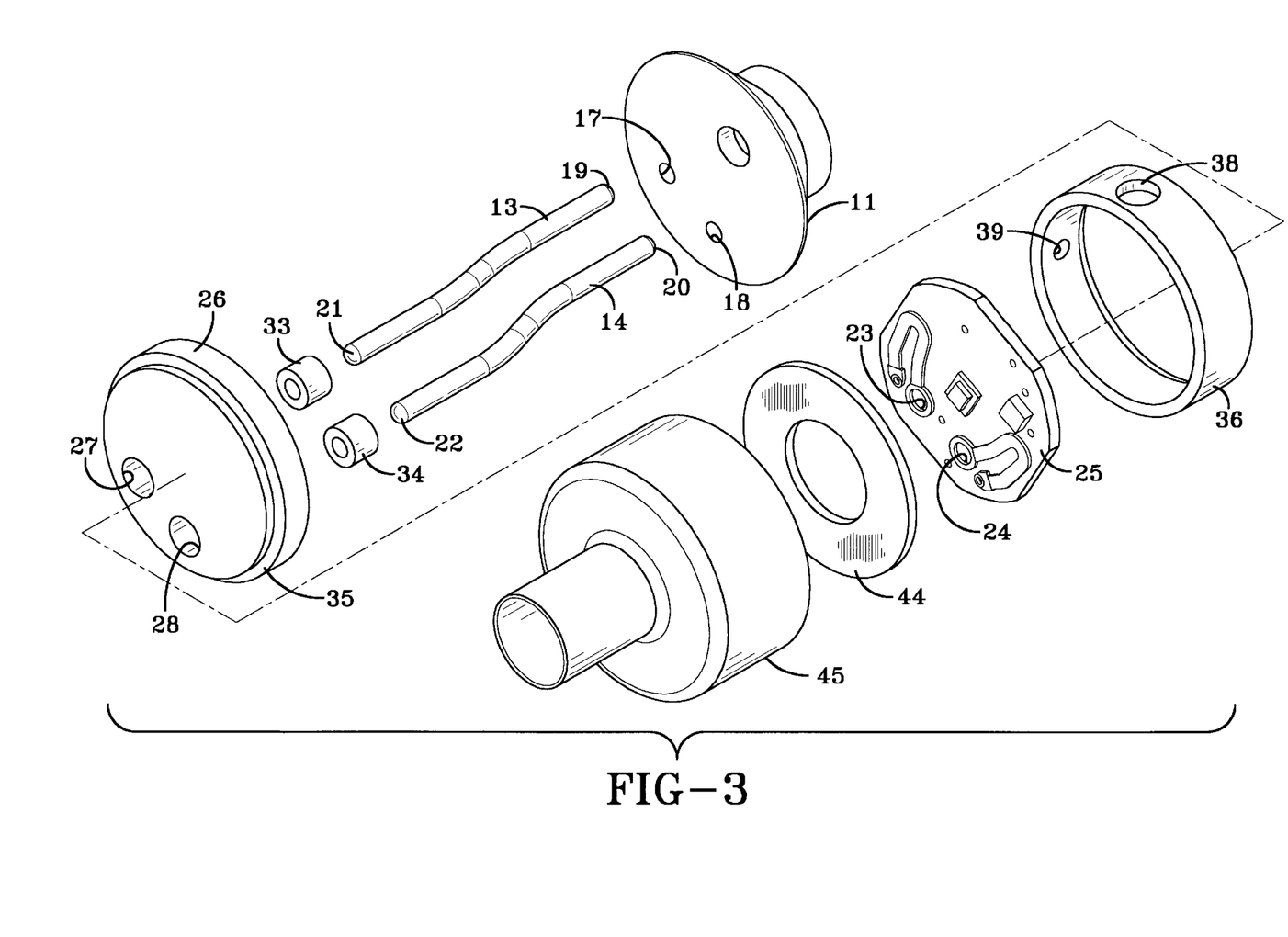
FIG. 3 is another exploded perspective view of the igniter of FIG. 1 looking from the opposite direction from the viewpoint of FIG. 2.

A plastic end cap 11 is provided at one end of the igniter 10. Two metallic pins 13, 14 extend through the plastic end cap via passageways 17,18 in the plastic end cap. One of the pins is a power supply pin and the other is a return pin. That is to say, in this exemplary embodiment there is a two-pin interface that is polarity independent. The pins perform the functions of conducting power to the igniter and conducting digital communication signals to and from the igniter. Of course, if desired, a three-pin configuration, with two pins for the power supply and a third pin for conducting digital transmission signals, could be employed without departing from the scope of the present invention.

A metal disk 26, sometimes referred to as a header, is disposed adjacent the plastic end cap 11, and has passageways 27, 28 therethrough which accommodate the passage of the electrically conductive pins through the metal disk. A protrusion 29 extends from one side of the metal disk and has an enlarged head 30, which facilitates the molding of the plastic end cap with the metal disk in this exemplary embodiment. It is understood that alternatively the plastic end cap may be attached to the metal disk by any suitable means for attachment such as adhesives, rivets, threaded fasteners, heating the metal disk and pressing it into the plastic end cap and so forth. Seals are formed between the electrically conductive pins 13, 14 and the metal disk by any suitable means such as placing glass tubes 33, 34 around the electrically conductive pins such that the glass tubes are located in the regions of the passageways 27, 28 through the metal disk and then heating the glass tubes to form glass-to-metal seals between the glass and the electrically conductive pins and the glass and the metal disk. The glass not only acts as a sealant but also as an electrical insulator between the electrically conductive pins and the metal disk. It is understood that any other suitable means of forming a seal between the electrically conductive pins and the metal disk and electrically isolating the electrically conductive pins and the metal disk such as an epoxy or plastic may be employed in the practice of the present invention.

Figure 4:
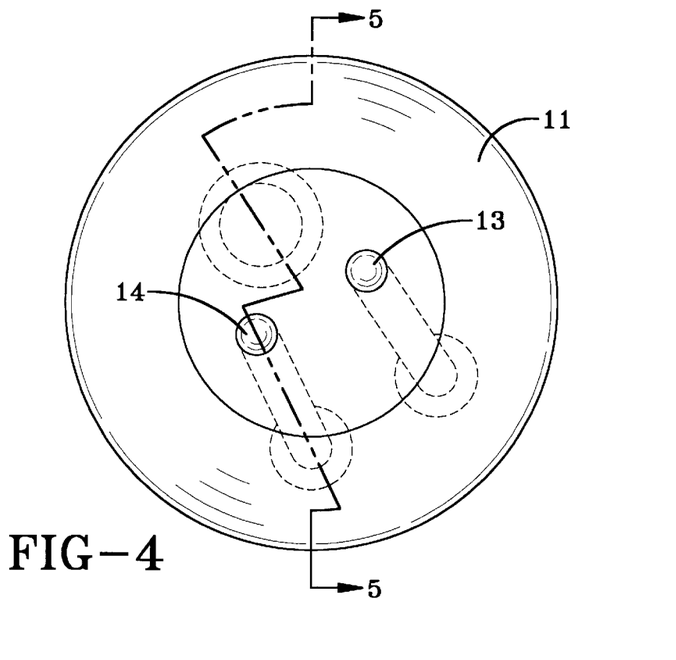
FIG. 4 is an end view of the igniter of FIG. 1.
Figure 5:
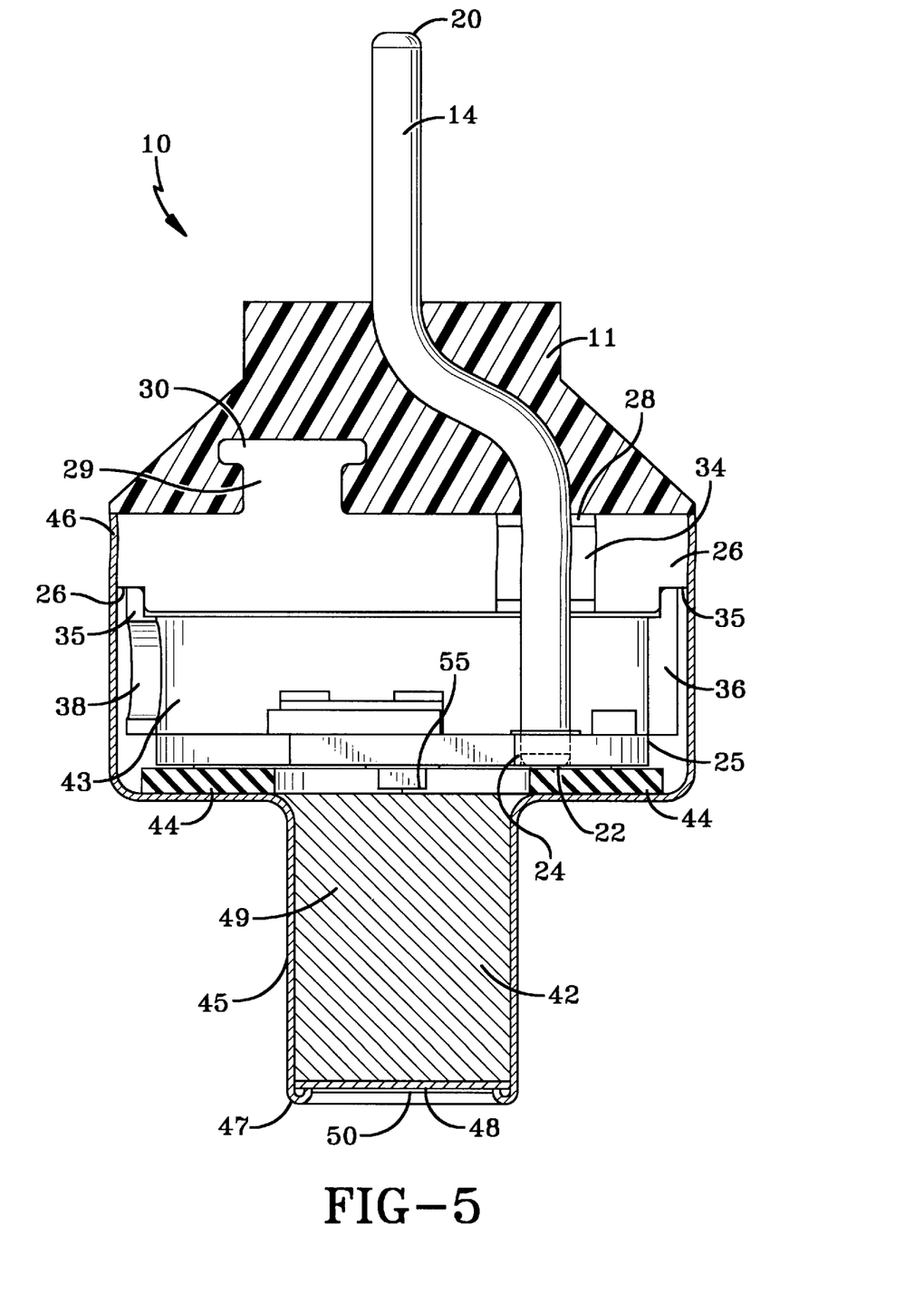
FIG. 5 is a longitudinal cross sectional view of the igniter of FIG. 1 taken along line 5—5 of FIG. 4.

The metal disk 26 is provided with a circumferentially extending ledge 35 that is located on the side of the metal disk that will be facing the circuit board when the igniter is assembled. A metal ring 36 is provided with a circumferentially extending ledge 37 at one end thereof which is complementary to the ledge 35 of the metal disk and the two ledges are retained in physical engagement with one another. A second end 40 of the metal ring abuts the circuit board 25. The metal disk 26, metal ring 36 and circuit board 25 cooperate to define a chamber 43 which is best shown in Fig.5 which is a longitudinal cross sectional view of the igniter of FIG. 1 taken along line 5—5 of FIG. 4.

Each of the pins 13, 14 is in electrically conductive contact with the circuit board 25 in the region of a second end 21, 22 of the pin. In this exemplary embodiment the electrically conductive pins extend through passageways 23, 24 in the circuit board, and are secured to the circuit board using an electrically conductive epoxy. In this exemplary embodiment the pins 13, 14 carry an operating current of about 1 milliamp and are made of a nickel/iron alloy. Preferably each of the pins is plated with gold along a portion of its length beginning at a first end 19, 20 to provide high integrity conductive frictional contact with a wiring harness connector that is identified by reference character 110 in FIG. 9.

Figure 6:
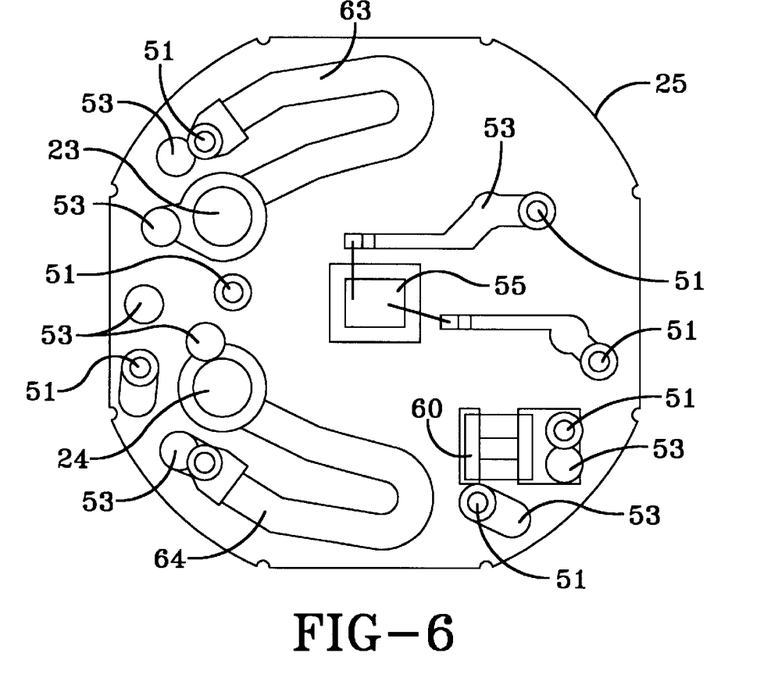
FIG. 6 is a plan view of a first side of a circuit board that is a component of the igniter of FIG. 1.
Figure 7:
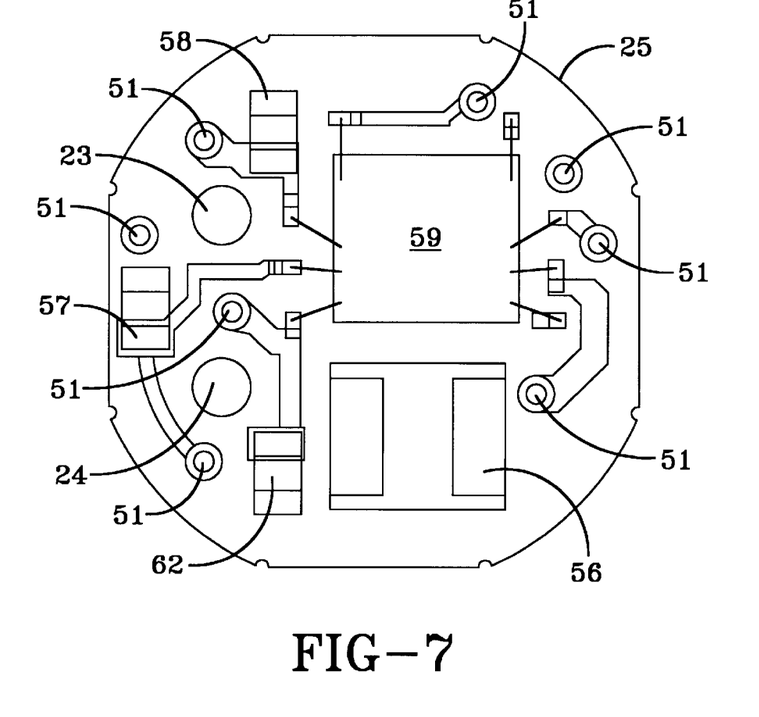
FIG. 7 is a plan view of a second side of a circuit board that is a component of the igniter of FIG. 1.
Figure 10:
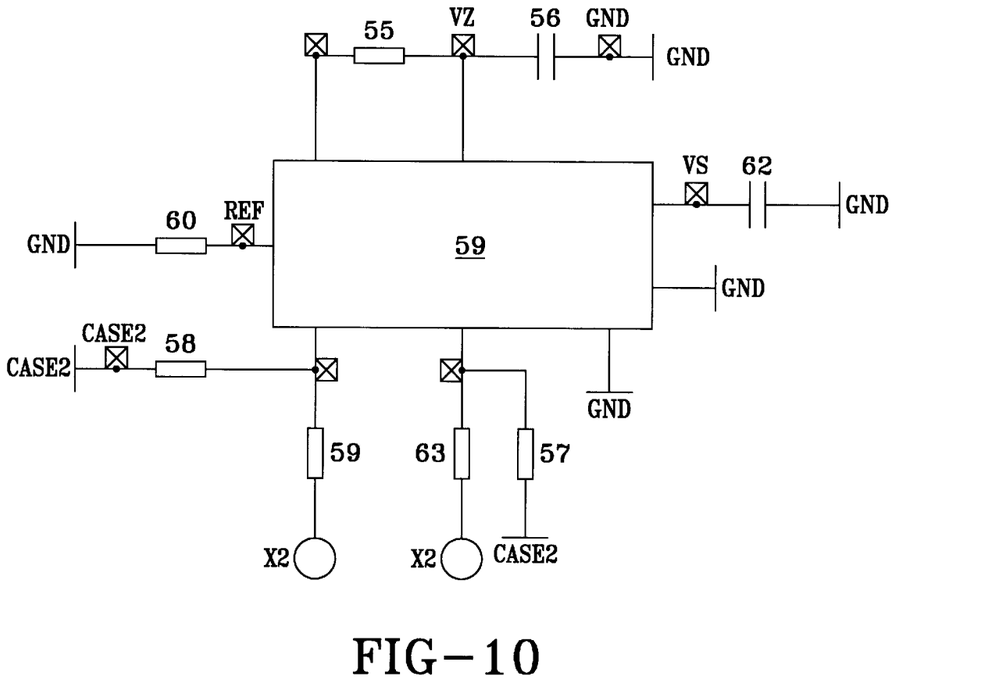
FIG. 10 is a schematic representation of the electrical circuit on the circuit board shown in FIGS. 6 and 7.

The circuit board 25 may comprise any suitable material such as a plastic or ceramic material. In this exemplary embodiment the circuit board is an aluminum oxide ceramic member having various circuit components attached thereto which are best understood by referring to FIGS. 6, 7 and 10. FIG. 6 is a diagrammatic plan view of the side of the circuit board which faces away from the chamber 43. FIG. 10, is a schematic representation of the electronic circuitry of the exemplary igniter the components associated with the circuit board. In FIG. 10 the components of the electronic circuitry are identified by the same reference characters as in FIGS. 6. and 7. Several vias 51 extend through the circuit board in the usual manner to facilitate electric circuits which extend between opposite sides of the circuit board. Several test pads 53 are printed on the circuit board in the usual manner to facilitate quality control tests of the electronics. Two printed resistors 63, 64 provide buffer resistance and suppress electro-magnetic interference ("EMI"). In this exemplary embodiment the resistivity of the printed resistors 63, 64 is about 110 ohms. Another resistor 60 sets up a diagnostic current for a controller 59, which is located on the opposite side of the circuit board. In this exemplary embodiment the resistivity of this resistor is about 75 K ohms with a 1% variation.

Referring next to FIG. 6, which is a diagrammatic plan view of the side of the circuit board which faces towards the chamber 43, and FIG. 10, which is a schematic representation of the electronic circuitry of the exemplary igniter the components associated with this side of the circuit board can be described.

A heating member 55 is located on the side of the circuit board which faces away from the chamber 43. The gas generating reaction in most gas generators is initiated with a heating member that is a bridgewire. A bridgewire material is selected from high melting temperature metal alloys that are corrosion resistant, tough enough to withstand reactive material loading pressures and that can be welded or soldered to electrical connectors. An electrical current passes through the bridgewire and generates heat that ignites the reactive material. Alternatively, a sputtered thin conductive film can be used as a heating member. However, it is preferred that the heating member of an igniter according to the present invention be a semiconductor bridge 55. Examples of semiconductor bridges are disclosed in U.S. Pat. No. 4,708,060; U.S. Pat. No. 4,831,933; U.S. Pat. No. 4,976,200; U.S. Pat. No. 5,179,248; and U.S. Pat. No. 5,309,841 which are incorporated herein by reference for the purpose of teaching semiconductor bridges that may be used in the practice of the present invention. A semiconductor bridge comprises a non-metallic substrate that carries a semiconductor layer, preferably comprising a doped silicon. A pair of electrically conductive lands, fabricated for example of aluminum or tungsten, are deposited on the semiconductor layer such that a gap separates the lands. A reactive material contacts the lands and bridges the gap. When electricity of sufficient voltage and current is applied across the gap via the lands a plasma is established in the gap. The plasma initiates the reactive material, which in turn initiates the enhancer, which in turn initiates the gas-generating compound in the gas generator.

Two varistors 57,58 provide protection against electro-static discharge ("ESD"). A decoupling capacitor 62 decouples switching transients from the controller 59. In the exemplary embodiment this decoupling capacitor has a capacitance of about 0.1 microfarads. A capacitor 56 stores energy that will be discharged to a heating member 55 when the igniter is activated. In the exemplary embodiment this energy storage device has a capacitance of about 2.2 microfarads.

In the preferred embodiment the controller 59 is an application specific integrated circuit (ASIC) that provides control and diagnostic functions for the igniter. The controller includes communication means for receiving igniter activation and integrity data commands from a master electronic control unit (ECU) via a high speed, digital electronic bi-directional serial communication bus, and for sending integrity data and fault warning messages onto the high speed, digital electronic bi-directional serial communication bus. Alternative embodiments to the high speed, digital electronic bi-directional serial communication bus include: a high speed, digital electronic bi-directional parallel communication bus; a high speed, digital electronic serial communication bus that is comprised of two electrical conductor cable; and a high speed, digital fiber-optic bi-directional serial communication bus.

The ECU (not shown) communicates with at least one igniter, but advantageously the ECU communicates with a plurality of igniters. The ECU also communicates with sensors such as, but not limited to, crash sensors, vehicle occupant size and position sensors, rollover sensors, seat position sensors, and seat belt usage sensors. A vehicle occupant safety device control system of this type is taught in U.S. Pat. Nos. 5,825,098 and 5,835,873 which are incorporated herein by reference for the purpose of teaching a vehicle occupant safety device control system that may advantageously employ the igniter of the present invention.

The controller has diagnostic means for comparing igniter controller integrity data, energy storage capacity data, and firing loop (heating means activation circuitry) integrity data to predetermined limits and generating fault warning messages and integrity status messages to the ECU. The diagnostic means comprises, for example, a multiplexer and an analog-to-digital converter for reading the safety device controller integrity data and for sending the controller integrity data to the ECU.

The controller has means for receiving a unique digital igniter activation command from the ECU and for sending an activation signal to an igniter activation means. The igniter activation means comprises one or more switches for coupling energy stored in the energy storage capacitor to the heater 55 for igniting reactive material upon receipt of an activation signal from the controller.

In a further embodiment of the invention, the device activation command and the integrity data command are comprised of a binary coded address part and a binary coded command part.

The controller further comprises a charge pump which is a power conversion means comprising a DC-to-DC converter for boosting power provided by the high speed, digital electronic bi-directional serial communication bus, for providing the boosted power to an energy storage capacitor 56, and, if desired, for providing power supply voltages to selected electronic circuits of the igniter.

In the exemplary embodiment described herein the communication means, diagnostic means, means for receiving a unique digital igniter signal and means for sending an activation signal to an igniter activation means, and the charge pump are contained in the electronic circuitry of the ASIC.

In summary, controlling the activation of an igniter according to the present invention includes the activities of: storing energy on an energy storage capacitor from a power supply by charging the energy storage capacitor comparing igniter controller integrity data, energy storage capacity data, and firing loop integrity data to predetermined limits and generating fault warning messages and integrity messages to the ECU; receiving a unique igniter activation command from an ECU over a communication bus; sending a device activation signal to an igniter activation means; and coupling the energy stored on the energy storage capacitor to the heating member device, causing the energy storage capacitor to discharge through a heating member causing a chemical reaction to begin. In the case of a vehicle occupant protection device the chemical reaction generates a gas that is used to inflate ad airbag, drive a piston in a pretensioner, cause a spool to rotate in a pretensioner, or any other desired use.

The ceramic circuit board used in this exemplary embodiment may not possess the level of strength that is required of this component in the igniter structure. It is recommended to fill the chamber 43 with an epoxy material, such as HYSOL-FD4450 HF from Dexter, to provide support for the ceramic circuit board. The injection of the epoxy material into the chamber is facilitated by two orifices 38, 39 through the metal ring 36. One of the orifices 38 is larger than the other 39. The epoxy material is injected into the chamber via the larger orifice and the smaller orifice allows air to be forced from the chamber as the epoxy material displaces the air.

After the chamber 43 has been filled with the epoxy material an elastomeric washer 44 is placed against the side of the circuit board which faces away from the chamber 43. A tubular metallic member 45 having a collar 46 at one end is placed around the other components with the collar 46 extending about the metal disk 26. The collar of the tubular metallic member is then affixed to the metal disk 26, by any suitable means. In the exemplary embodiment the collar of the tubular metallic member is affixed to the metal disk 26 by laser welding.

A reactive material 49 is placed in a chamber 42 defined by the tubular metallic member 45 and the side of the circuit board 25 that faces away from the chamber 43. In the exemplary embodiment the reactive material is in powdered or granular form and is tamped into the chamber 42 using a force of about 680 atmospheres (10,000 pounds per square inch). The epoxy material in the chamber 43 on the opposite side of the circuit board supports the circuit board and prevents the circuit board from damage during the tamping procedure. The open end 47 is then sealed. In the exemplary embodiment this seal is made by inserting a metal disk 48 a short distance into the tubular metallic member 45. The metal disk 48 has a diameter only slightly smaller than the inside diameter of the tubular metallic member 45. The end 47 of the tubular metallic member is then bent over radially inwardly to secure the metal disk in place against the reactive material. A coating 50 of a conformal material is placed on the metal disk and end 47 of the tubular metallic member to create an environmental seal. In the exemplary embodiment the conformal material is cured with ultraviolet light.

Figure 8:
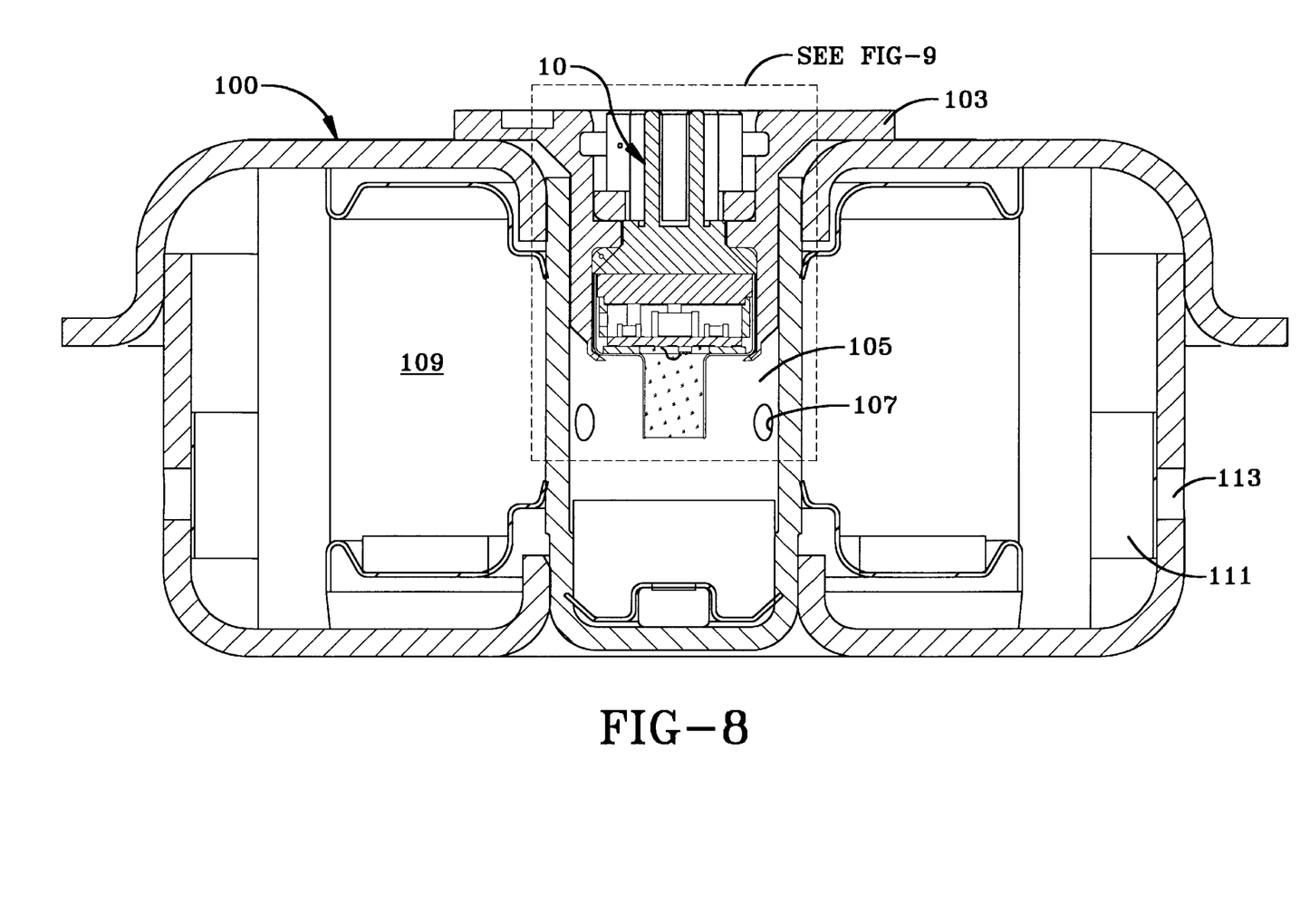
FIG. 8 is a cross sectional view of an assembly of the igniter of FIG. 1 with a gas generator.
Figure 9:
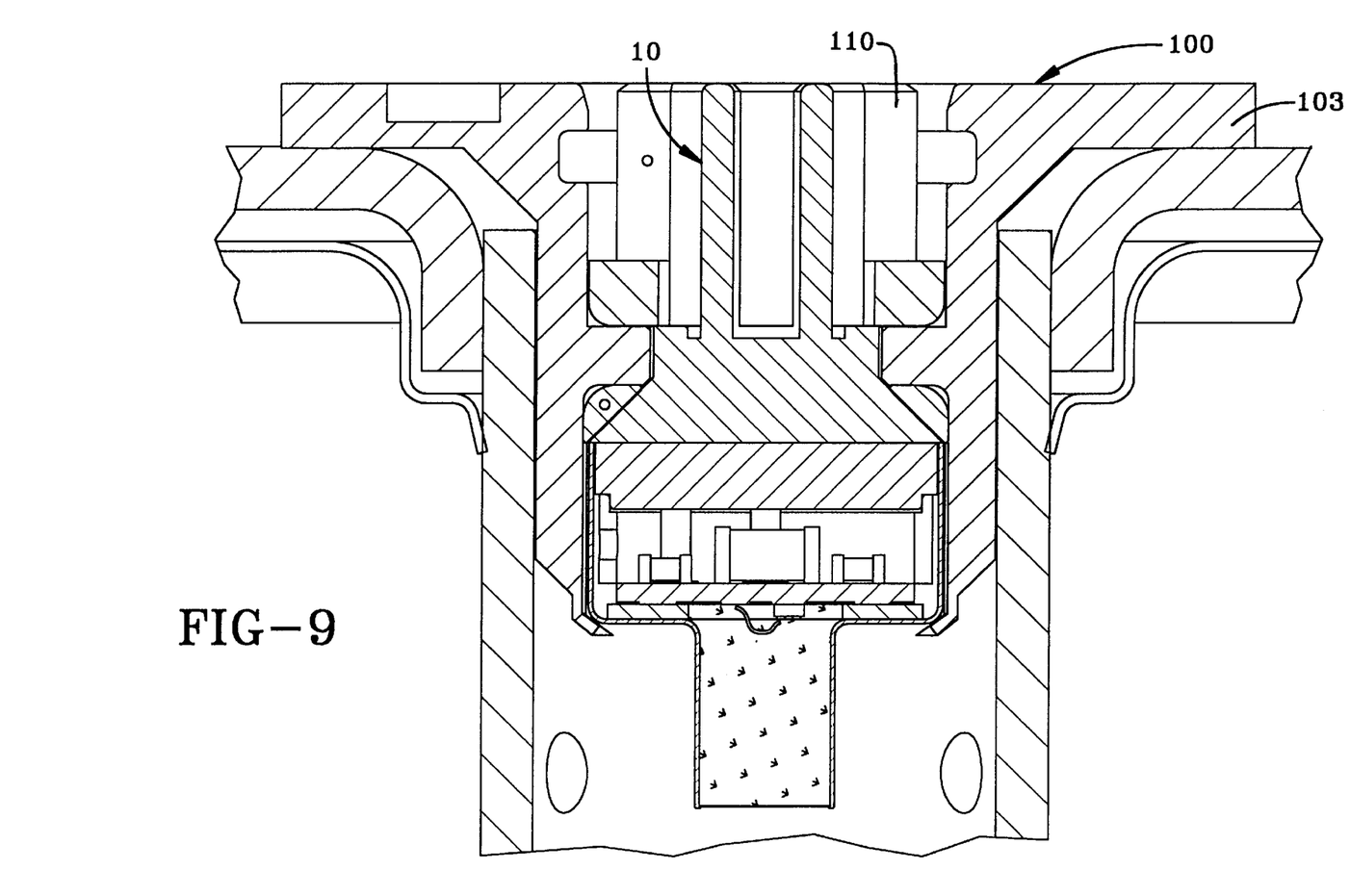
FIG. 9 is an enlarged fragmentary view of a portion of the assembly shown in FIG. 8.

The assembly of an igniter of the present invention with a gas generator is best understood by referring to FIGS. 8 and 9. FIG. 8 is a cross sectional view of an assembly of the igniter 10 with a gas generator 100. FIG. 9 is an enlarged fragmentary view of a portion of the assembly shown in FIG. 8. This exemplary gas generator has a housing which defines a first chamber 105 that contains a reactive material that is an ignition enhancer material, or primer, and a second chamber 109 that contains a reactive material which generates gas when ignited. The igniter 10 ignites the reactive material in the first chamber 105, which passes through openings 107 to ignite the reactive material in the second chamber 109. Gas generated by the reactive material in the second chamber typically passes through a filter 111 and exits the gas generator via openings 113 to inflate an airbag, or to operate a pretensioner or other gas operated device. An igniter receiving member 103 secures the igniter to the gas generator. It is understood that the gas generator shown in FIGS. 8 and 9 is merely exemplary and that the igniter of the present invention may be used with any gas generator design, and that a single gas generator device may be assembled with more than one igniter of the present invention. It is understood that the igniters of the present invention may also be used with hybrid airbag inflators.

Although the present invention has been described in considerable detail with reference to certain preferred versions thereof, other versions are possible. It should be understood that the embodiments described herein are merely exemplary and that many alternate embodiments and additional embodiments will become apparent to those skilled in the art. Accordingly such alternative embodiments are to be construed as being within the spirit of the present invention even though not explicitly set forth herein, the present invention being limited only by the content and scope of claims appended hereto.

We claim:

1. An igniter for actuating a gas generator comprising:
    a metal disk, having a first side and a second side;
    a metal ring abutting the second side of the metal disk;
    a circuitboard having a first side, and a second side opposite the first side;
  a microprocessor disposed on said first side, the first side of the circuitboard abutting the metal ring to form a first chamber between the first side of the circuitboard, the metal ring, and the metal disk;
    a quantity of material filling the first chamber;
    a heating member disposed on the second side of the circuitboard;
    a tubular metal member forming a second chamber which extends below the second side of the circuit board beneath the heating member, the tubular metal member having a collar which extends toward and is affixed to the metal disk;
    a quantity of reactive material filling the second chamber and pressed against the heating member; and
    at least two metal pins extending through the metal desk into electrical contact with the first side of the circuit board.

2. The igniter of claim 1 further comprising a plastic cap disposed adjacent to the first side of the metal disk, and a fixed to the metal disk.

3. The igniter of claim 2 wherein the plastic cap is affixed to the metal disk by a protrusion extending from the first side of the metal disk which engages with the plastic cap.

4. The igniter of claim 1 wherein the reactive material is of a granular or powdered form, and wherein the second chamber is formed as an open ended metal tube which is closed by a second metal disk having a diameter only slightly smaller than the inside diameter of the tube, the second metal disk being positioned a short distance into the metal tube and retained in position by portions of the metal tube which are bent over radially inwardly to secure the second metal disk in place against the reactive material.

5. The igniter of claim 4 further comprising a coating of conformal material placed on the second metal disk at the end of the tubular member to create an environmental seal.

6. The igniter of claim 1 further comprising an elastomeric washer placed between the second side of the circuitboard and the tubular member.

7. The igniter of claim 1 wherein the collar of the tubular metal member is affixed to the metal disk by a laser weld.

8. The igniter of claim 1 wherein each of said at least two metal pins is electrically isolated from the metal desk by a quantity of glass which seals the metal pins to the metal disk.

9. The igniter of claim 1 wherein the quantity of material filling the first chamber is epoxy.

10. The igniter of claim 1 wherein the circuitboard is constructed of aluminum oxide ceramic.

11. The igniter of claim 1 wherein the metal ring has portions forming at least two openings to facilitate the injection of the quantity of material filling the first chamber.

12. The igniter of claim 1 wherein the metal disk is provided with a circumferentially extending ledge that is located on the side of the metal disk facing the circuitboard, and wherein the metal ring is provided with a circumferentially extending ledge complementary to the ledge on the metal disk, the two ledges retained in physical engagement with one another.

13. An igniter for actuating a gas generator comprising:
    a circuitboard having a first side, and a microprocessor disposed on said first side, the circuit board having a second side opposite the first side, and a heating member disposed on said second side;
    a tubular metal member forming a first chamber adjacent the first side of the circuit board, between the circuitboard and a first metal disk, and a second chamber adjacent the second side of the circuitboard between the circuit board second side and a second metal disk, the first chamber containing a quantity of epoxy to support the first side of the circuitboard, the second chamber containing a quantity of reactive material compressed against the heating member; and
    at least two metal pins extending through the metal disk into electrical contact with the first side of the circuit board.

14. The igniter of claim 13 further comprising a plastic cap disposed adjacent the first side of the metal disk, and affixed to the metal disk.

15. The igniter of claim 14 wherein the plastic cap is affixed to the metal disk by a protrusion extending from the first side of the metal disk which engages with the plastic cap.

16. The igniter of claim 13 wherein the reactive material is of a granular or powdered form, and wherein the second metal disk has a diameter only slightly smaller than the inside diameter of the metal tubular member at the second chamber, the second metal disk being positioned a short distance into the metal tube and retained in position by portions of the metal tubular member which are bent over radially inwardly to secure the second metal disk in place against the reactive material.

17. The igniter of claim 16 further comprising a coating of conformal material placed on the first metal disk at the end of the tubular member to create an environmental seal.

18. The igniter of claim 13 further comprising an elastomeric washer placed between the second side of the circuitboard and the tubular member.

19. The igniter of claim 13 wherein the tubular member has collar which is affixed to the first metal disk by a laser weld.

20. The igniter of claim 13 wherein each of said at least two metal pins is electrically isolated from the metal desk by a quantity of glass which seals the metal pins to the metal disk.

21. The igniter of claim 13 wherein the circuitboard is constructed of aluminum oxide ceramic.

22. A method of constructing an igniter comprising the steps of:
    placing a circuitboard having a microprocessor on a first side, and a heating member on a second side opposite the first side, in a tubular metal member to form a first chamber adjacent the first side, and a second chamber adjacent to the second side;

filling the first chamber with epoxy to form a support for the circuit board;

placing a quantity of reactive material in the second chamber and compressing said reactive material against the heating member; and sealing the reactive material from the environment.

23. The method of claim 22 wherein the reactive material is of a granular or powdered form, and wherein the second chamber is formed as an open ended metal tube; and further comprising the step of placing a metal disk having a diameter only slightly smaller than the inside diameter of the tube a short distance into the tube and bending portions of the tube radially inwardly to secure the disk in place against the reactive material.

24. The method of claim 23 wherein the step of sealing the reactive material material from the environment further comprises coating the metal desk with a conformal coating.

25. The method of claim 22 wherein the reactive material is compressed against the heating member with the pressure of 10,000 pounds per square inch.

* * * * *